(12) United States Patent
Shingu et al.

(10) Patent No.: US 7,015,767 B2
(45) Date of Patent: *Mar. 21, 2006

(54) FUNCTION GENERATOR AND TEMPERATURE COMPENSATED CRYSTAL OSCILLATOR

(75) Inventors: Keigo Shingu, Tokyo (JP); Eiichi Kaminishi, Kanagawa (JP); Hisato Takeuchi, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 82 days.

This patent is subject to a terminal disclaimer.

(21) Appl. No.: 10/773,305

(22) Filed: Feb. 9, 2004

(65) Prior Publication Data

US 2004/0183609 A1   Sep. 23, 2004

(30) Foreign Application Priority Data

Feb. 19, 2003 (JP) ............................. 2003-041121
Dec. 8, 2003 (JP) ............................. 2003-408424

(51) Int. Cl.
*H03L 1/00* (2006.01)
(52) U.S. Cl. .................. 331/176; 331/158; 331/116 R; 331/116 FE; 331/66
(58) Field of Classification Search ................ 331/176, 331/158, 116 R, 116 FE, 66
See application file for complete search history.

(56) References Cited

U.S. PATENT DOCUMENTS 5,719,533 A * 2/1998 Shibuya et al. ............. 331/176

FOREIGN PATENT DOCUMENTS

JP    P2003-8386 A    1/2003

* cited by examiner

*Primary Examiner*—Arnold Kinkead
(74) *Attorney, Agent, or Firm*—McDermott Will & Emery LLP

(57) ABSTRACT

With first, second and third current exchanger circuits cascaded, a current in proportion to a difference between an ambient temperature Ta and a reference temperature Tr is input to the first current exchanger circuit. The first current exchanger circuit supplies a current in proportion to the square of Ta−Tr to the second current exchanger circuit, the second current exchanger circuit supplies a current in proportion to the fourth power of Ta−Tr to the third current exchanger circuit, and the third current exchanger circuit outputs a current in proportion to the fifth power of Ta−Tr. Each of the first, second and third current exchanger circuits has a configuration which does not require a high supply voltage enough to drive a series circuit of three or more diodes.

6 Claims, 14 Drawing Sheets

US 7,015,767 B2

FUNCTION GENERATOR AND TEMPERATURE COMPENSATED CRYSTAL OSCILLATOR

BACKGROUND OF THE INVENTION

The present invention relates to a function generator suitable for temperature compensation of crystal oscillation frequency and a temperature compensated crystal oscillator using the function generator.

Various electronic equipments are required not only to be compact and light but also have high reliability and high accuracy these days. In such a background, a crystal resonator is widely used for generating a clock signal or the like in a large number of electronic equipments. The oscillation frequency of a crystal oscillating circuit using a crystal resonator is desired to be highly stable particularly against variation of the ambient temperature. An AT-cut quartz resonator is now the most commonly utilized as the crystal resonator.

It is known that the oscillation frequency of a crystal oscillating circuit using a crystal resonator is largely varied in accordance with the variation of the ambient temperature Ta when the temperature is not compensated. For example, the proportion of an oscillation frequency Fa (at the ambient temperature Ta) to a reference frequency Fr (at a reference temperature Tr) is varied by several tens ppm in accordance with the variation of the ambient temperature Ta ranging between −30° C. and +80° C. Also, the reference frequency Fr fluctuates. Such variation and fluctuation of the oscillation frequency can be a significant problem in an electronic equipment with high accuracy. Accordingly, there is a demand for a crystal oscillating circuit with a more stable oscillation frequency. For example, it is necessary to suppress the variation in the frequency proportion Fa/Fr to 2.5 ppm or less and the fluctuation of the reference frequency Fr to 0.3 ppm or less.

In the electronic equipment with high accuracy, therefore, temperature compensation for the crystal oscillation frequency is generally effected. For example, the crystal resonator is connected with a variable capacitance diode in series, and a compensation voltage in accordance with the ambient temperature Ta is applied to the variable capacitance diode.

In a conventional technique, where N is 1 or a larger integer, a constant current unaffected by the ambient temperature Ta is made to flow to a series circuit of N diodes, a current in proportion to the difference between the ambient temperature Ta and the reference temperature Tr is made to flow to a series circuit of N+1 diodes, and a difference between voltages generated in the above-described circuits is applied between the base and the emitter of an output transistor. Thus, a current in proportion of the N+1th power of Ta−Tr is generated in the collector of the output transistor. If, assuming that N=2, a current in proportion to the cube of Ta−Tr is generated and a compensation voltage to be applied to a variable capacitance diode is generated from the current, third order temperature compensation can be achieved (see U.S. Pat. No. 5,719,533).

For equipment requiring even higher accuracy with respect to temperature compensation, a high order control technique such as a fourth-order or fifth-order control technique is necessary (Japanese Unexamined Patent Publication No. 2003-8386).

To form a cubic function generator in the conventional technique in which a diode series is used, a supply voltage which can drive a series circuit of three diodes is necessary. Moreover, a driving voltage for four diodes and a driving voltage for five diodes are required for forming a fourth-order function generator and a fifth-order function generator, respectively.

SUMMARY OF THE INVENTION

An object of the present invention is to provide a function generator and a temperature compensated crystal oscillating circuit which are operable at a low voltage to reduce power consumption of portable equipment represented by a cellular phone.

To achieve the object, according to the present invention, two or more current exchanger circuits are cascaded to form a cubic or higher order function generator. Each of the current exchanger circuits has the function of receiving, where n is 1 or a larger integer, a current in proportion to the nth power of a difference between the ambient temperature Ta and the reference temperature Tr and outputting a current in proportion to the n+1th or 2nth power of Ta−Tr.

DESCRIPTION OF THE PREFERRED EMBODIMENTS

Figure 1:
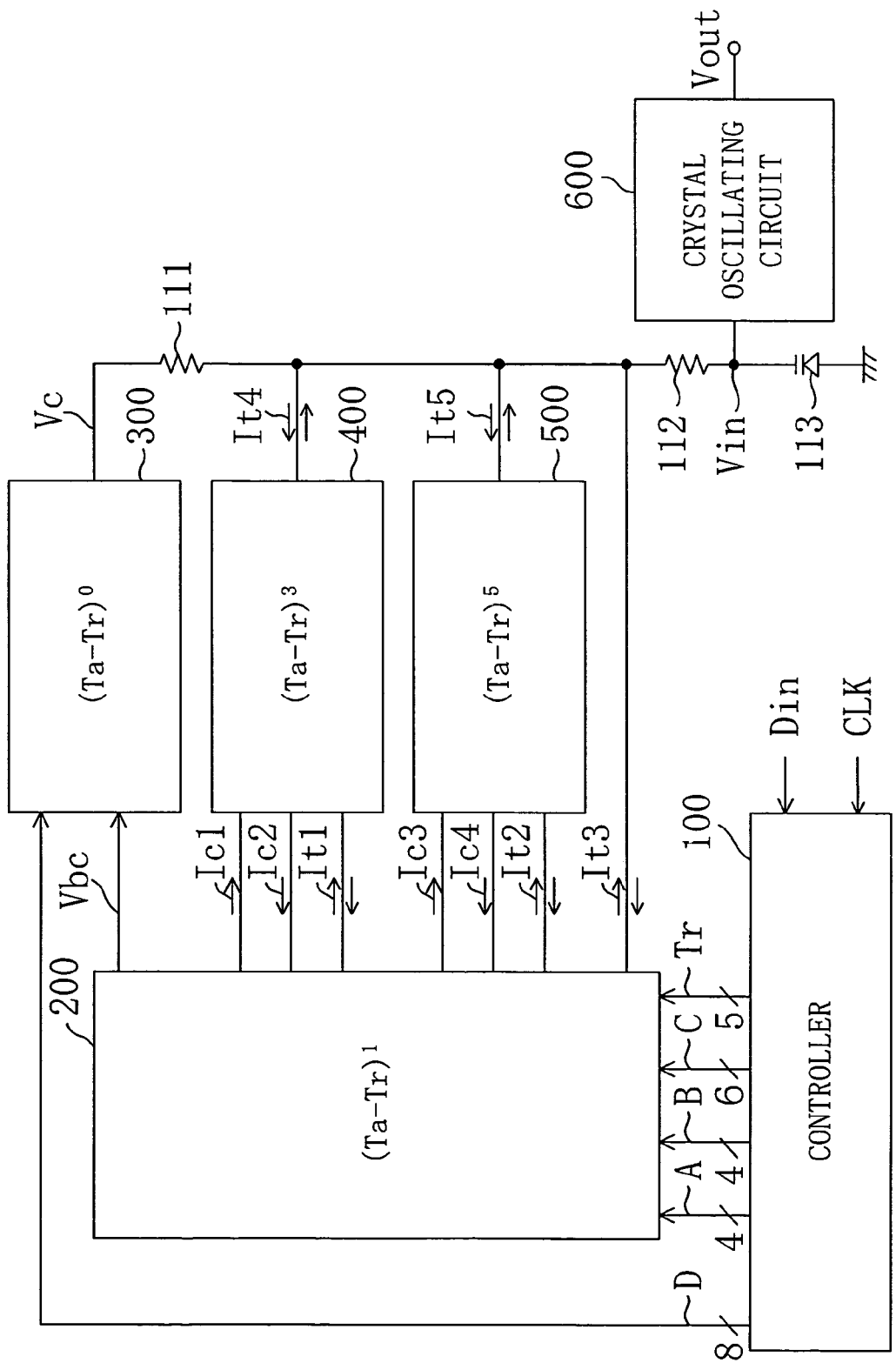
FIG. 1 is a block diagram illustrating a temperature compensated crystal oscillator according to the present invention.

FIG. 1 shows an exemplified configuration of a compensated temperature crystal oscillator according to the present invention. The compensated temperature crystal oscillator of FIG. 1 includes a controller 100, a linear function generator 200, a zero-order function generator 300, a cubic function generator 400, a fifth-order function generator 500, two resistors 111 and 112, a variable capacitance diode 113 and a crystal oscillating circuit 600. Herein, where Tr is a reference temperature, a compensation voltage Vin to be applied to the variable capacitance diode 113 so that the oscillation frequency of the crystal oscillating circuit 600 is constant regardless of an ambient temperature Ta is given as Formula 1.

$$Vin=-A(Ta-Tr)^5-B(Ta-Tr)^3+C(Ta-Tr)+D \quad \text{[Formula 1]}$$

where each of A, B, C and D is a constant other than 0.

The controller 100 is a shift register including twenty-seven flip-flops. The controller 100 receives an input of a serial data signal Din and a shift clock signal CLK and supplies signals corresponding to the four constants A, B, C and D in Formula 1 and the reference temperature Tr. Signals A, B, C, D and Tr are four bits, four bits, six bits, eight bits and five bits, respectively.

In response to the signals A, B, C, D and Tr, the linear function generator 200 performs the following functions: The function of supplying a constant base voltage Vbc unaffected by the ambient temperature Ta; the function of current sources Ic1 and Ic3 for discharging a constant current unaffected by the ambient temperature Ta; the function of current sources Ic2 and Ic4 for absorbing a constant current unaffected by the ambient temperature Ta; the function of current sources It1, It2 and It3 for discharging a current in proportion to Ta−Tr in the case of Ta≧Tr and absorbing a current in proportion to |Ta−Tr| in the case of Ta<Tr.

The cubic function generator 400 connected to the current sources Ic1, Ic2 and It1 generates a bidirectional current It4 in proportion to the cube of Ta−Tr in the case of Ta≧Tr and in proportion to the cube of |Ta−Tr| in the case of Ta<Tr.

The fifth-order function generator 500 connected to the current sources Ic3, Ic4 and It2 generates a bidirectional current It5 in proportion to the fifth power of Ta−Tr in the case of Ta≧Tr and in proportion to the fifth power of |Ta−Tr| in the case of Ta<Tr.

The zero-order function generator 300 receives the base voltage Vbc and the signal D and generates a constant voltage Vc regardless of the ambient temperature Ta.

A series circuit including the two resistors 111 and 112 and the variable capacitance diode 113 constitutes means for converting the sum of an output current It3 of the linear function generator 200, an output current It4 of the cubic function generator 400 and an output current It5 of the fifth function generator 500 into a voltage and supplying as a compensation voltage Vin the sum of the voltage resulting from the conversion and an output voltage Vc of the zero-order function generator 300 to the crystal oscillating circuit 600. The compensation voltage Vin can be given by Formula 1. A voltage Vout is an output voltage of the crystal oscillating circuit 600.

Figure 2:
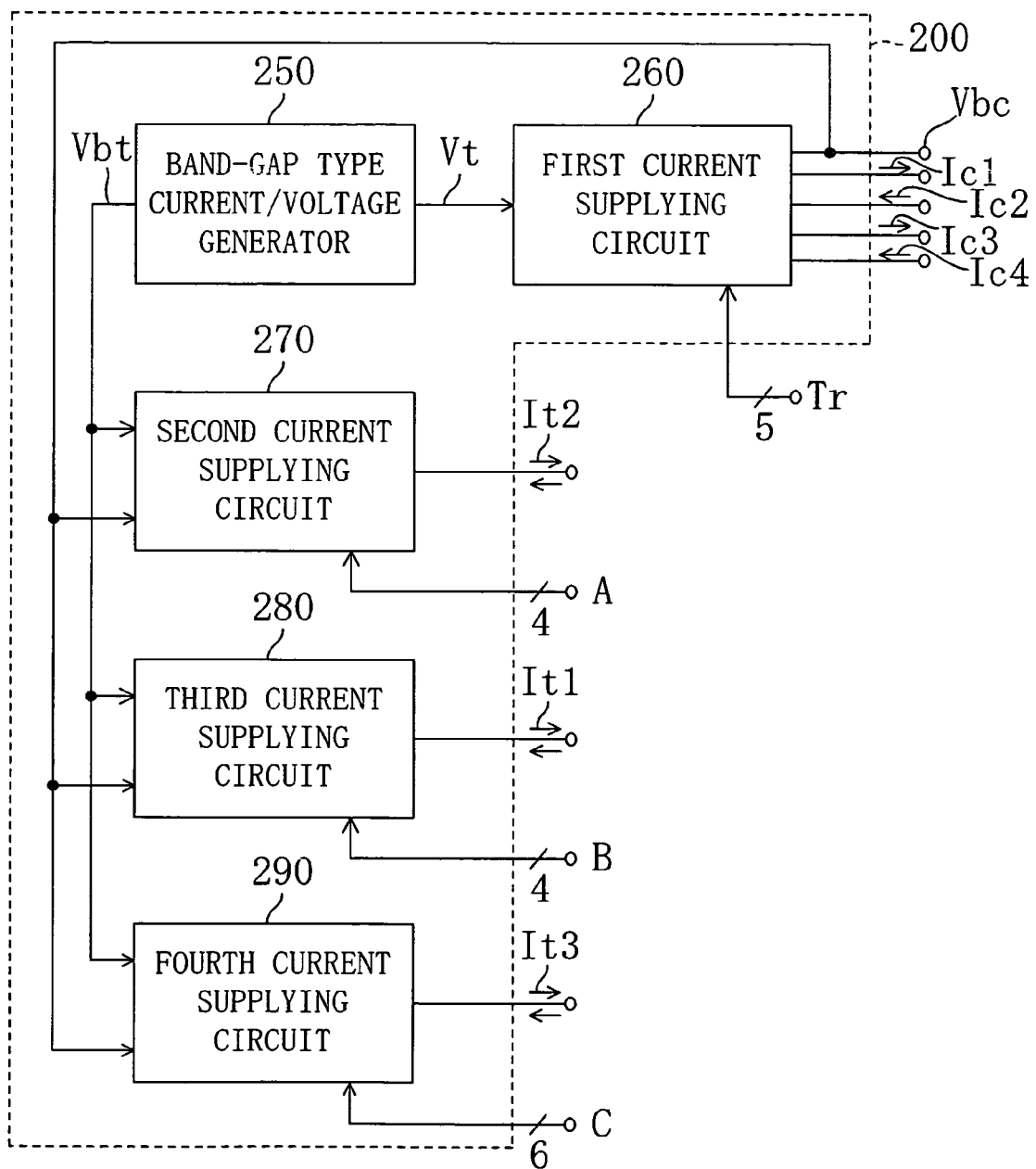
FIG. 2 is a block diagram illustrating the internal configuration of a linear function generator of FIG. 1.

FIG. 2 shows the internal configuration of the linear function generator 200. The linear function generator 200 includes a band-gap type current/voltage generator 250, a first current supplying circuit 260, a second current supplying circuit 270, a third current supplying circuit 280, and a fourth current supplying circuit 290.

Figure 3:
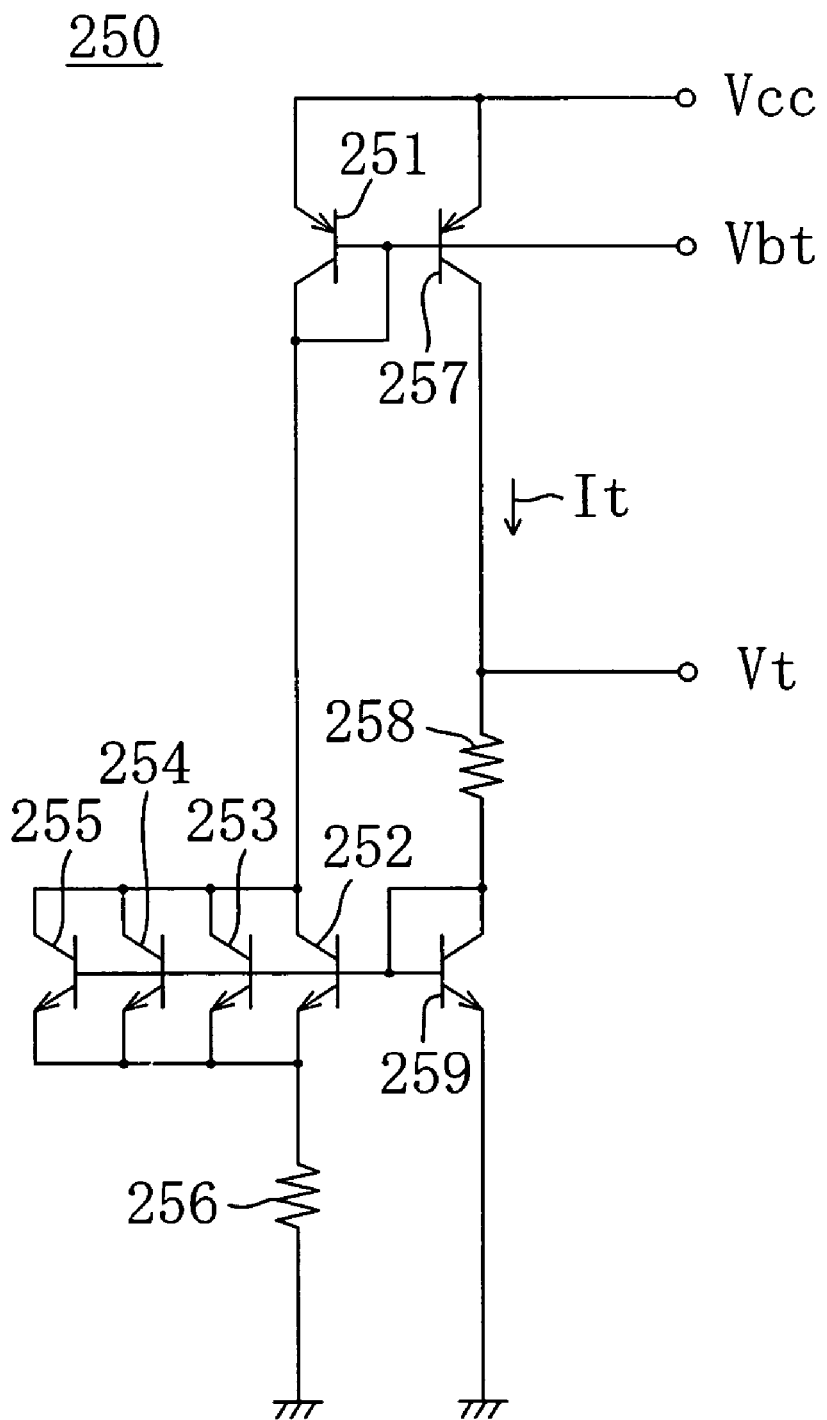
FIG. 3 is a circuit diagram illustrating the detailed configuration of a band-gap type current/voltage generator of FIG. 2.

FIG. 3 shows the detailed configuration of the band-gap type current/voltage generator 250. The band-gap type current/voltage generator 250 of FIG. 3 includes two PNP transistors 251 and 257, five NPN transistors 252, 253, 254, 255 and 259, and two resistors 256 and 258. A voltage Vbt is a base voltage for transferring a current represented by a linear function of the ambient temperature Ta, a current It is a current increasing in proportion to the ambient temperature Ta, and a voltage Vt is a voltage increasing in proportion to the ambient temperature Ta.

Figure 4:
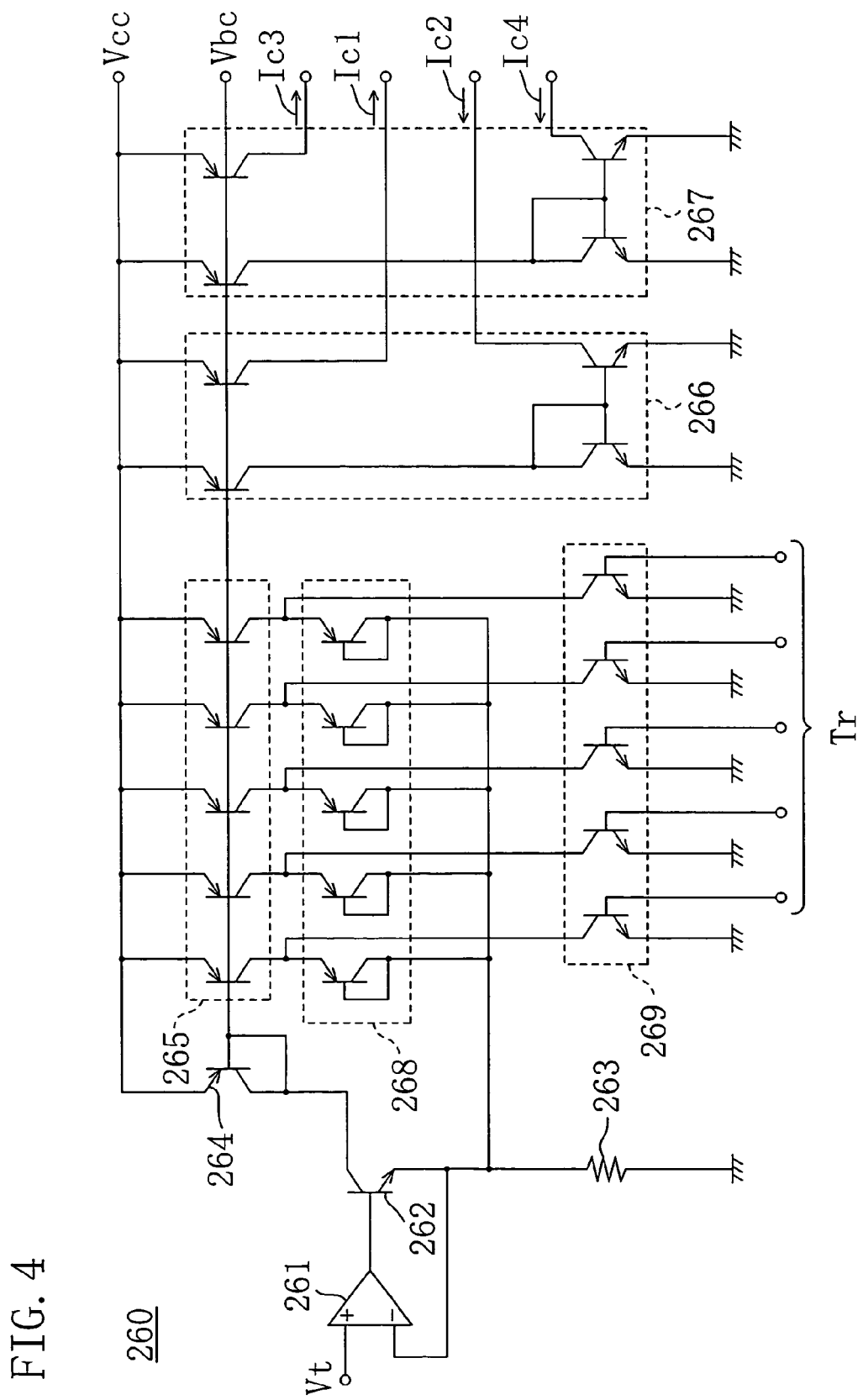
FIG. 4 is a circuit diagram illustrating the detailed configuration of a first current supplying circuit of FIG. 2.

FIG. 4 shows the detailed configuration of the first current supplying circuit 260. The first current supplying circuit 260 of FIG. 4 includes an operational amplifier 261, an NPN transistor 262, a resistor 263, and a PNP transistor 264. The base voltage Vbc of the PNP transistor 264 is used for transferring a constant collector current unaffected to the ambient temperature Ta. The first current supplying circuit 260 of FIG. 4 further includes, correspondingly to the five bits of the signal Tr, five PNP transistors 265 sharing the base voltage Vbc, two current output circuit 266 and 267, five PNP transistors 268 for current feedback to the emitter of the NPN transistor 262, and five NPN transistors 269 for switching. When the number of ON transistors among the five NPN transistors 269 is changed in response to the signal Tr of five bits, each of the currents Ic1, Ic2, Ic3 and Ic4 is varied in accordance with the changed number of the ON transistors.

Figure 5:
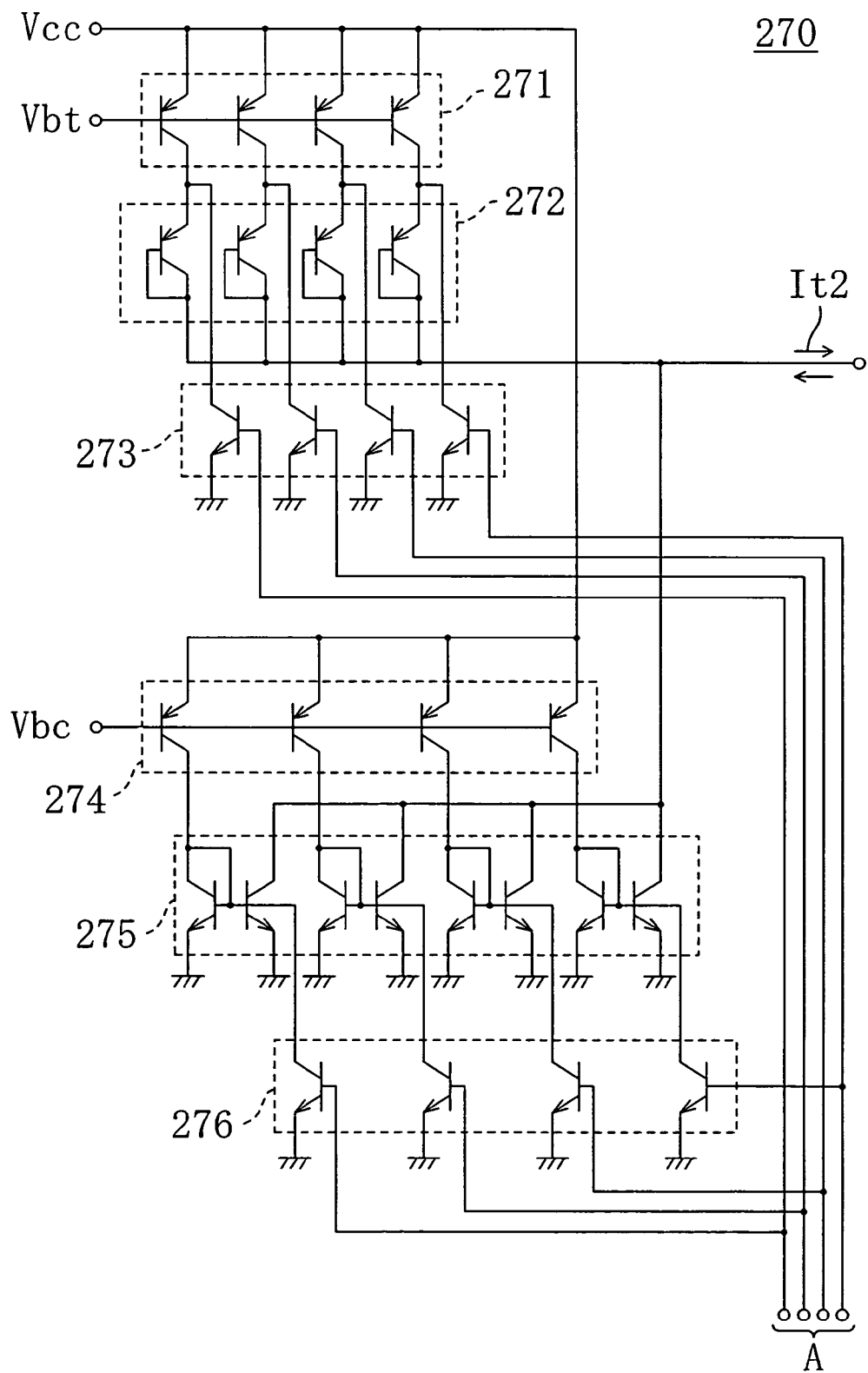
FIG. 5 is a circuit diagram illustrating the detailed configuration of a second current supplying circuit of FIG. 2.

FIG. 5 shows the detailed configuration of the second current supplying circuit 270.

The second current supplying circuit 270 of FIG. 5 includes, correspondingly to the four bits of the signal A, four PNP transistors 271 sharing the base voltage Vbt, four PNP transistors 272 for discharging a current, four NPN transistors 273 for switching, four PNP transistors 274 sharing the base voltage Vbc, eight NPN transistors 275 together forming four current mirror circuits for absorbing a current, and four NPN transistors 276 for switching. When the number of ON transistors among the four NPN transistors 273 and the number of ON transistors among the four transistors 276 are changed in response to the signal A of four bits, the current It2 is varied in accordance with the changed number of the ON transistors.

Figure 6:
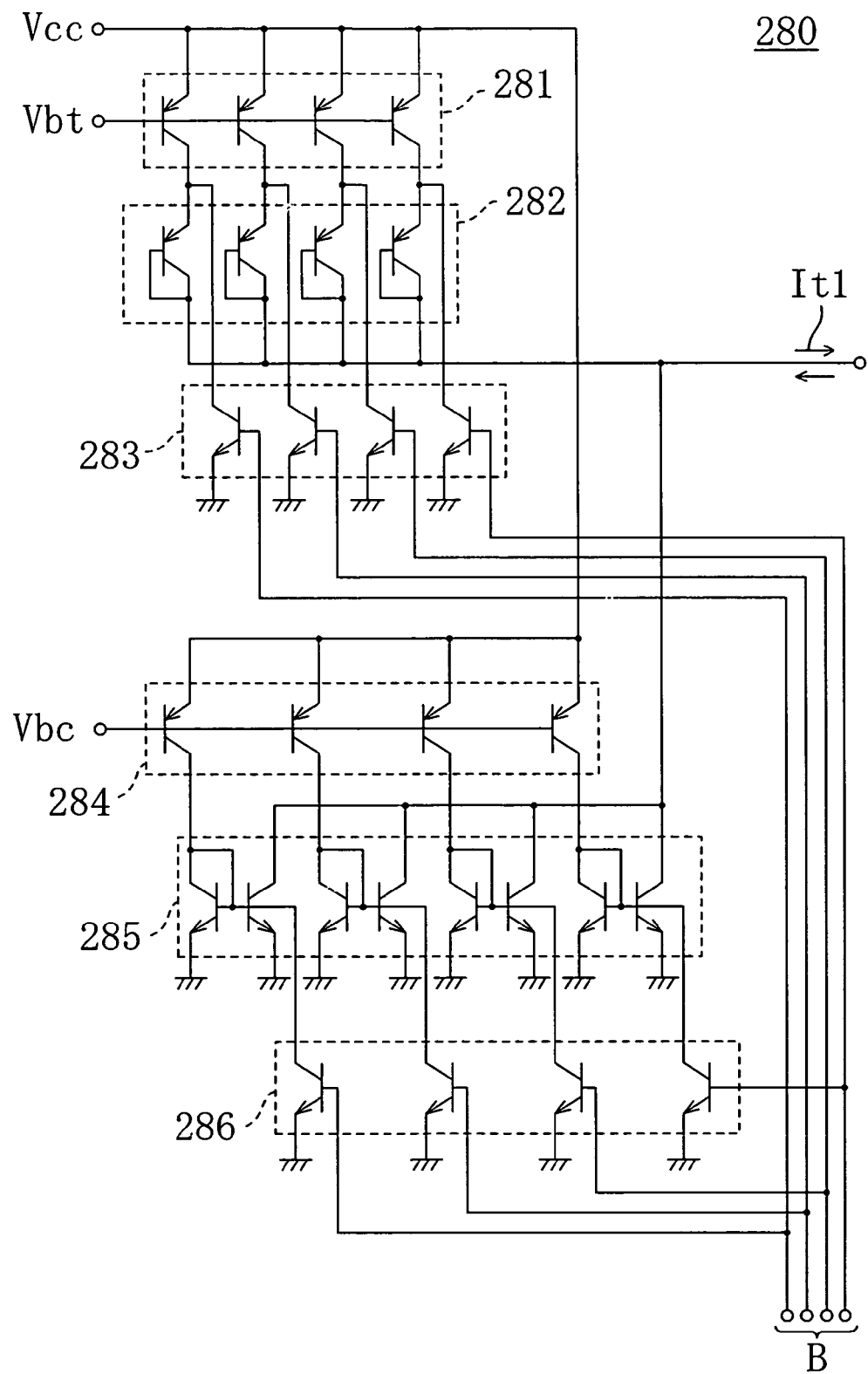
FIG. 6 is a circuit diagram illustrating the detailed configuration of a third current supplying circuit of FIG. 2.

FIG. 6 shows the detailed configuration of the third current supplying circuit 280. The third current supplying circuit 280 of FIG. 6 includes, correspondingly to the four bits of the signal B, four PNP transistors 281 sharing the base voltage Vbt, four PNP transistors 282 for discharging a current, four NPN transistors 283 for switching, four PNP transistors 284 sharing the base voltage Vbc, eight NPN transistors 285 together forming four current mirror circuits for absorbing a current, and four NPN transistors 286 for switching. When the number of ON transistors among the four NPN transistors 283 and the number of ON transistors among the four NPN transistors 286 are changed in response to the signal B of four bits, the current It1 is varied in accordance with the changed number of the ON transistors.

Figure 7:
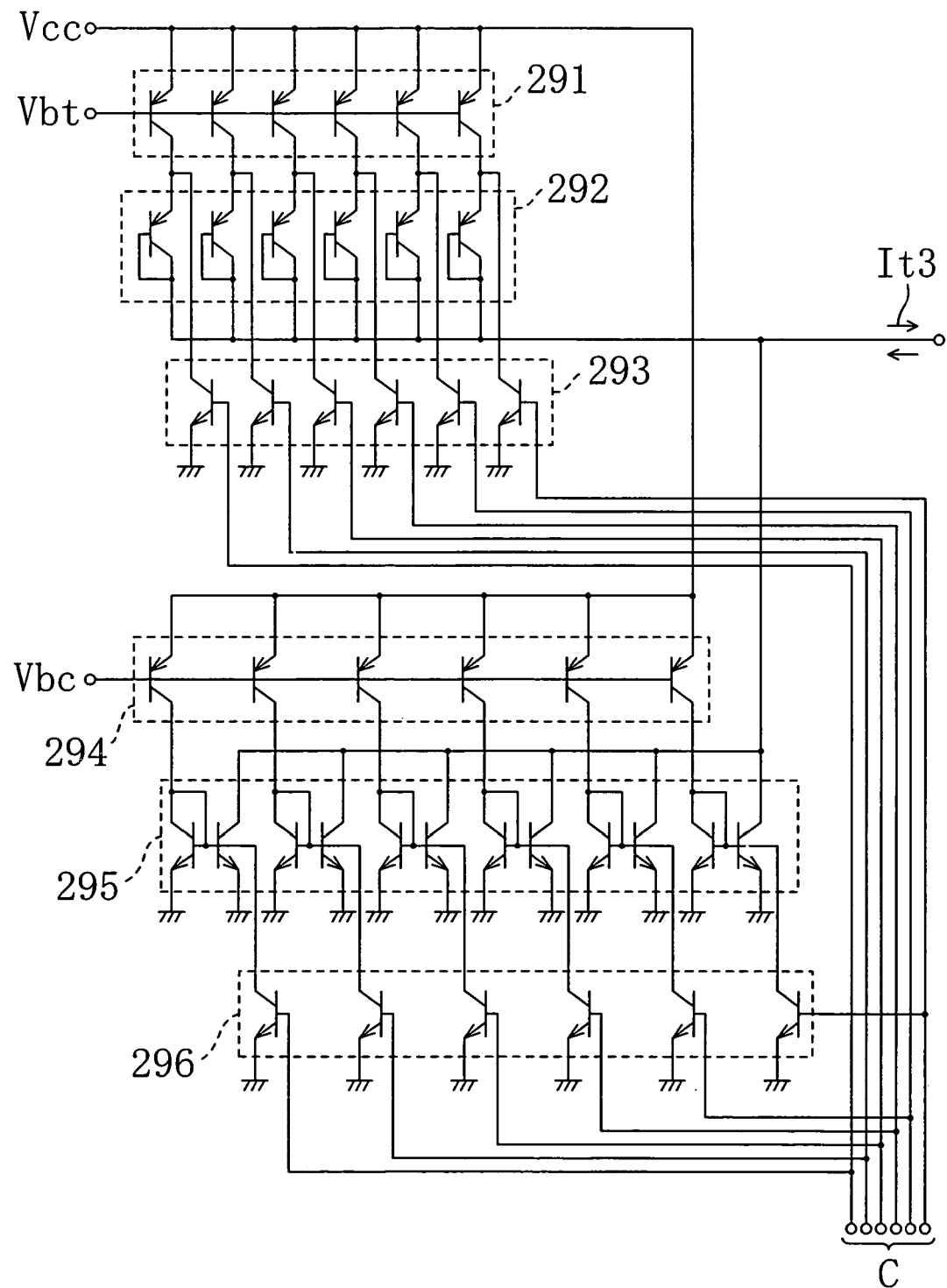
FIG. 7 is a circuit diagram illustrating the detailed configuration of a fourth current supplying circuit of FIG. 2.

FIG. 7 shows the detailed configuration of the fourth current supplying circuit 290. The fourth current supplying circuit 290 of FIG. 7 includes, correspondingly to the six bits of the signal C, six PNP transistors 291 sharing the base voltage Vbt, six PNP transistors 292 for discharging a current, six NPN transistors 293 for switching, six PNP transistors 294 sharing the base voltage Vbc, twelve NPN transistors 295 together forming six current mirror circuits for absorbing a current, and six NPN transistors 296 for switching. When the number of ON transistors among the six NPN transistors 293 and the number of ON transistors among the six NPN transistors 296 are changed in response to the signal C of six bits, the current It3 is varied in accordance with the changed number of the ON transistors.

Figure 8:
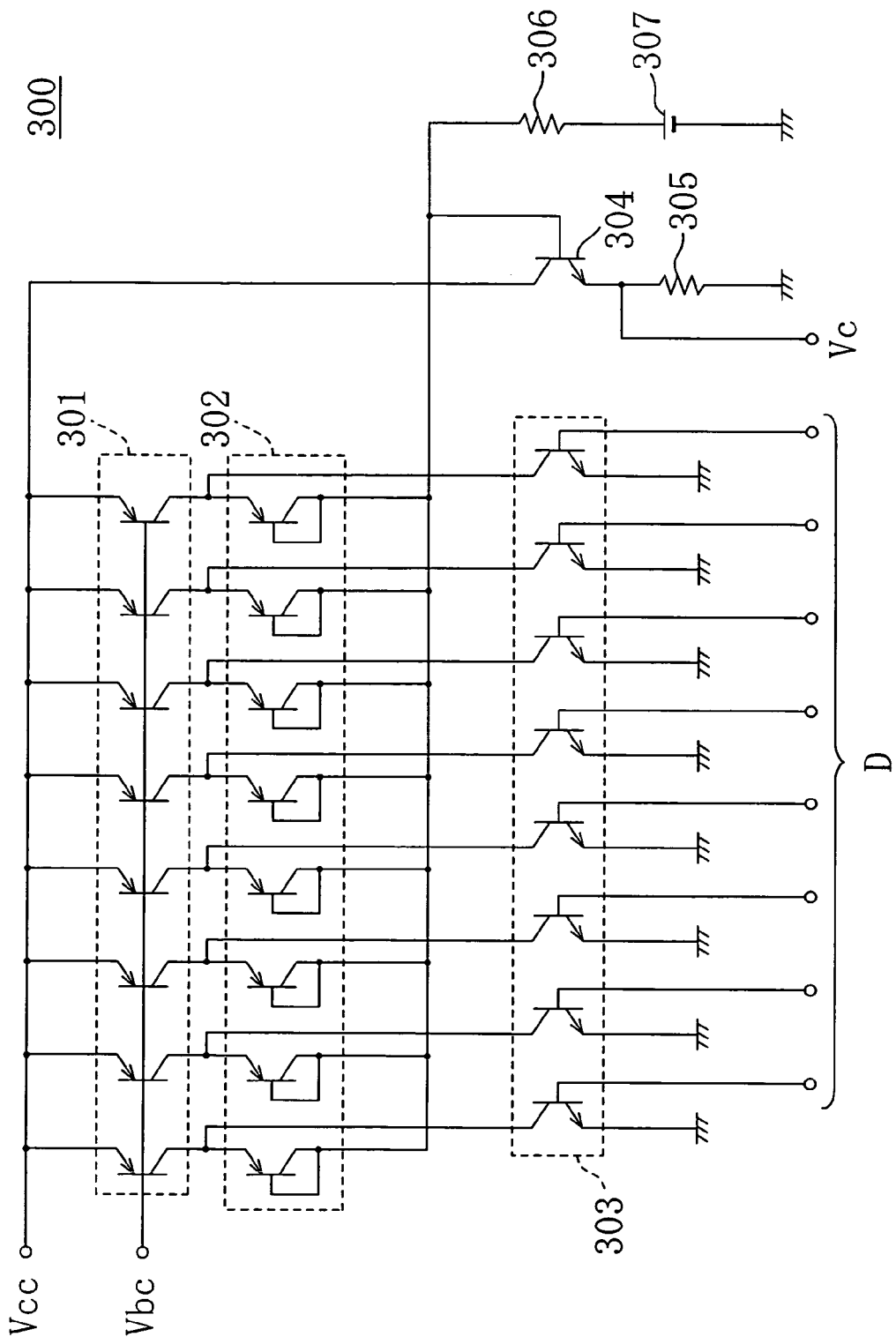
FIG. 8 is a circuit diagram illustrating the detailed configuration of a zero-order function generator of FIG. 1.

FIG. 8 shows the detailed configuration of the zero-order function generator 300 of FIG. 1. The zero-order function generator 300 of FIG. 8 includes a current source consisting of, correspondingly to the eight bits of the signal D, eight PNP transistors 301 sharing the base voltage Vbc, eight PNP transistors 302 for discharging a current, and eight NPN transistors 303 for switching. The zero-order function generator 300 of FIG. 8 further includes an NPN transistor 304 for supplying a constant voltage Vc regardless of the ambient temperature Ta, two resistors 305 and 306, and a constant voltage supply 307. When the number of the ON transistors among the eight NPN transistor 303 is changed in response to the signal D of eight bits, the voltage Vc is varied in accordance with the changed number of the ON transistors.

Figure 9:
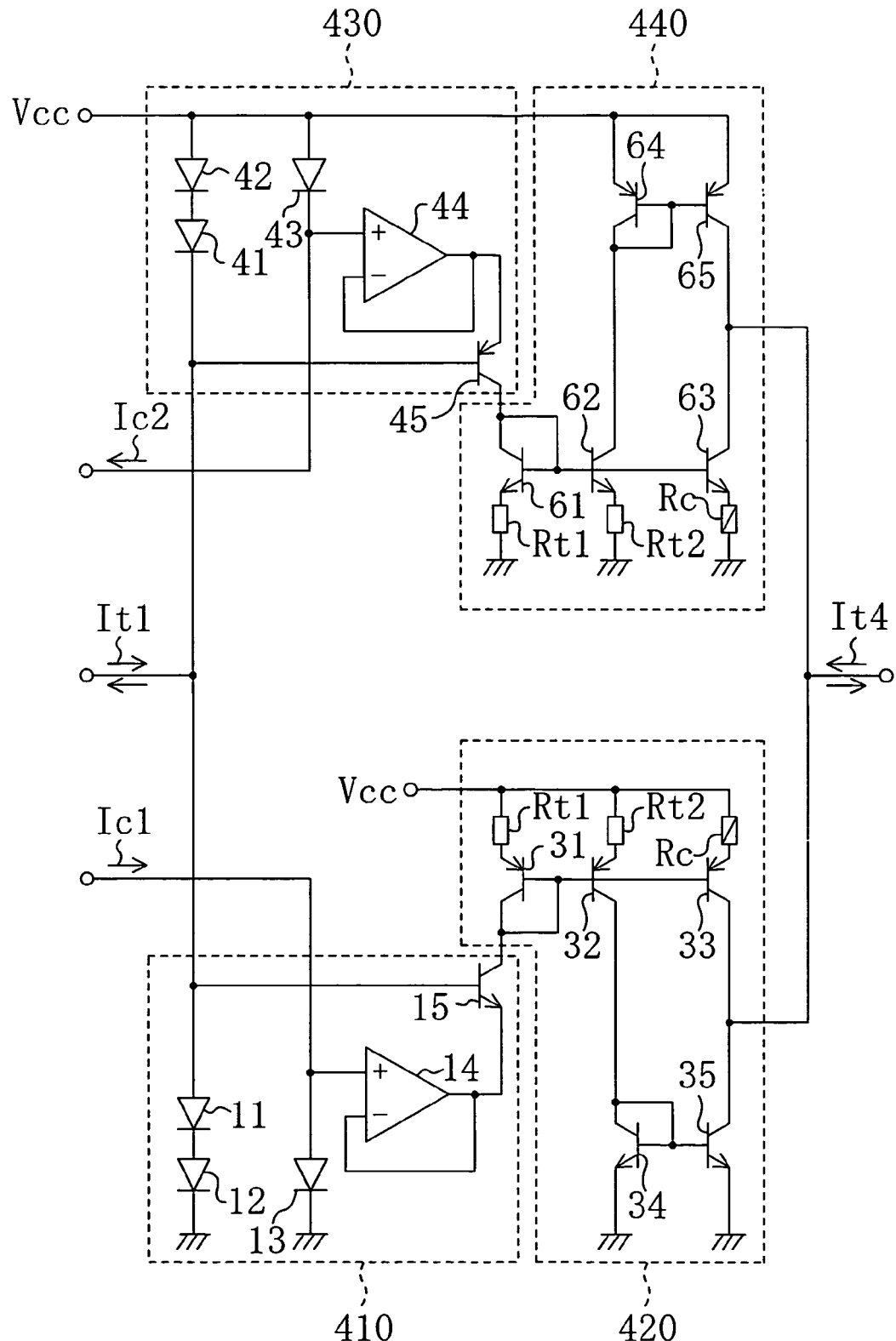
FIG. 9 is a circuit diagram illustrating the detailed configuration of a cubic function generator of FIG. 1.

FIG. 9 shows the detailed configuration of the cubic function generator 400 of FIG. 1. The cubic function generator 400 of FIG. 9 includes a first current exchanger circuit 410, a second current exchanger circuit 420, a third current exchanger circuit 430, and a fourth current exchanger circuit 440. The first current exchanger circuit 410 is a quadratic function generator obtained where N=1 holds in the conventional technique and includes three diodes 11, 12 and 13, an operational amplifier 14, and an NPN transistor 15. The second current exchanger circuit 420 is a current mirror circuit including three PNP transistors 31, 32 and 33, two NPN transistors 34 and 35, three resistors Rt1, Rt2 and Rc. The third current exchanger circuit 430 is a complementary circuit of the first current exchanger circuit 410 and includes three diodes 41, 42 and 43, an operational amplifier 44, and a PNP transistor 45. The fourth current exchanger circuit 440 is a complementary circuit of the second current exchanger circuit 420 and includes three NPN transistors 61, 62 and 63, two PNP transistors 64 and 65, and three resistors Rt1, Rt2 and Rc.

When Ta≧Tr, in the first current exchanger circuit 410, the current It1 flows into a series of diodes 11 and 12 to generate a voltage at the anode of the diode 11. While the generated voltage is given to the base of the NPN transistor 15, a voltage generated in the diode 13 is given to the emitter of the NPN transistor 15 via the operational amplifier 14.

Here, a current value for the current source Ic1 is indicated as a constant Ir, the voltage at the anode of the diode 13 is indicated as V13, and the voltage at the anode of the series of diodes 11 and 12 is indicated as V11. Also, the saturation current of each of the diodes and transistors is indicated as Is. In this case, the following formulas hold.

$$V13 = Vth \times \ln(Ir/Is) \quad \text{[Formula 2]}$$

$$V11 = 2 \times Vth \times \ln(It1/Is) \quad \text{[Formula 3]}$$

$$Vth = k \times Ta/q \quad \text{[Formula 4]}$$

where k indicates the Bolzmann's constant and q indicates the charge amount of an electron. Also, when the collector current of the NPN transistor 15 is indicated as I15, the following formula can be obtained.

$$I15 = Is \times \exp\{(V11-V13)/Vth\} \quad \text{[Formula 5]}$$

Thus, based on Formulas 2, 3 and 5, the following formula can be obtained.

$$I15 = Ir \times (It1/Ir)^2 \quad \text{[Formula 6]}$$

Also, assumed that the current It1 satisfies the following formula.

$$It1 = Ir \times \{(Ta-Tr)/Tr\} \quad \text{[Formula 7]}$$

When the current It1 is supplied, the following formula can be obtained.

$$I15 = Ir \times \{(Ta-Tr)/Tr\}^2 \quad \text{[Formula 8]}$$

Similarly, when Ta≧Tr, in the second current exchanger circuit 420, a voltage corresponding to a value for the collector current I15 of the NPN transistor 15 is generated at each of the bases of the PNP transistors 31, 32 and 33, and then a current corresponding to the generated voltages flows from the collectors of the PNP transistors 32 and 33. Then, owing to an operation of the NPN transistor 34, a current of a value corresponding to the collector current of the PNP transistor 32 flows into the collector of the NPN transistor 35. A current resulting from a difference between the collector current value of the PNP transistor 33 and the collector current value of the NPN transistor 35 is generated at an output terminal of the cubic function generator 400.

In this case, the resistors Rt1 and Rt2 inserted and connected between a power source terminal Vcc and the emitter of the PNP transistor 31 and between the power source terminal Vcc and the emitter of the PNP transistor 32, respectively, have a first temperature coefficient, and the resistor Rc inserted and connected between the power source terminal Vcc and the emitter of the PNP transistor 33 has a second temperature coefficient. When the resistor Rc is formed of polysilicon, a resistance value for the resistor Rc can be made constant regardless of the ambient temperature Ta. On the other hand, when each of the resistors Rt1 and Rt2 is formed of a diffused resistor, the temperature coefficient of a resistance value Rt of the resistors Rt1 and Rt2 can be represented by the linear function of Ta−Tr. That is to say, with a constant a, the following formula holds.

$$Rt/Rc = 1 + a \times (Ta-Tr) \quad \text{[Formula 9]}$$

The constant a is several thousands ppm/° C. Accordingly, when the respective collector currents of the PNP transistor 33 and the NPN transistor 35 are indicated as I33 and I35, respectively, the following formulas are obtained.

$$I33 = I15 \times Rt/Rc \quad \text{[Formula 10]}$$

$$I35 = I15 \quad \text{[Formula 11]}$$

$$It4 = I33 - I35 \quad \text{[Formula 12]}$$

Thus, the following formula holds.

$$It4 = Ir \times Tr \times a\{(Ta-Tr)/Tr\}^3 \quad \text{[Formula 13]}$$

That is to say, the output current It4 of the second current exchanger circuit 420 is a current in proportion to the cube of Ta−Tr.

Similarly, when Ta<Tr, the third and fourth current exchanger circuits 430 and 440 are operated, so that a current in proportion to the cube of |Ta−Tr| can be obtained as the output current It4 of the fourth current exchanger circuit 440.

Figure 10A:
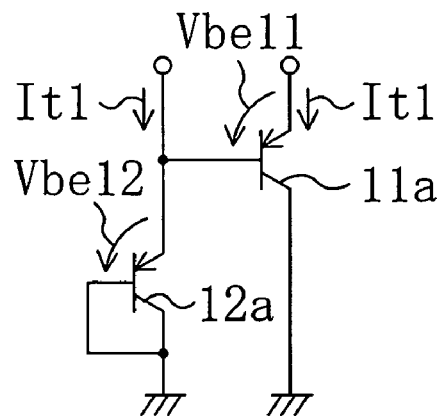
FIGS. 10A and 10B are circuit diagrams illustrating configurations in which each diode in a first current exchanger circuit of FIG. 9 has a transistor configuration.
Figure 10B:
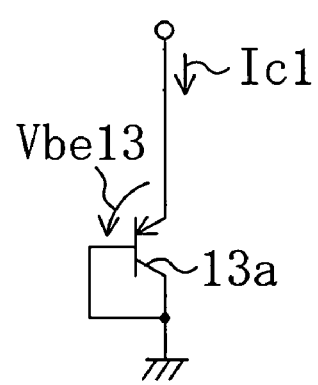

FIGS. 10A and 10B are circuit diagrams illustrating configurations in which each of the diodes 11, 12 and 13 in the first current exchanger circuit 410 of FIG. 9 has a transistor configuration. In FIG. 10A, the base and collector of a PNP transistor 12a are grounded, the emitter of the PNP transistor 12a is connected to the base of another PNP transistor 11a, and the current It1 is applied to the respective emitters of the PNP transistors 11a and 12a. In FIG. 10B, the emitter of the PNP transistor 13a is operated as the anode and a common connection section of the collector and base of the PNP transistor 13a is operated as a cathode. Thus, the sum of the respective base/emitter voltages Vbe11 and Vbe12 of the two PNP transistors 11a and 12a corresponding to the current value of the power source It1 is regarded as a voltage for two diodes. Also, the base/emitter voltage Vbe13 of the PNP transistor 13a corresponding to the current value of the power source Ic1 is regarded as a voltage for one diode.

Figure 11A:
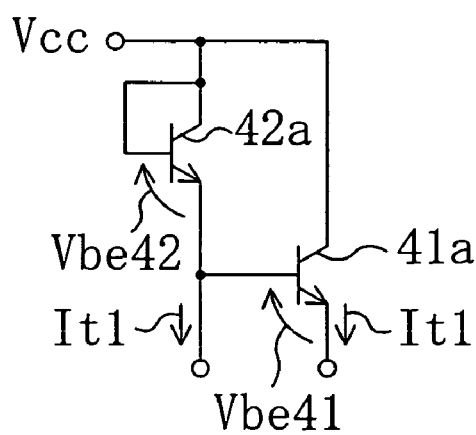
FIGS. 11A and 11B are circuit diagrams illustrating configurations in which each diode in a third current exchanger circuit of FIG. 9 has a transistor configuration.
Figure 11B:
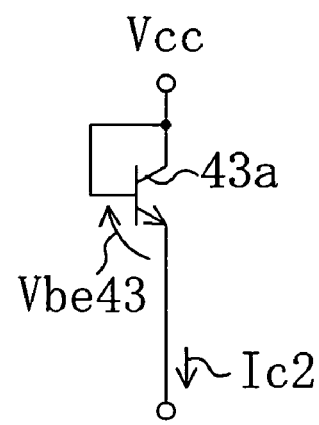

FIGS. 11A and 11B are circuit diagrams illustrating configurations in which each of diodes 41, 42 and 43 in the second current exchanger circuit 430 of FIG. 9 has a transistor configuration. In FIG. 1A, the base and collector of an NPN transistor 42a are connected to the power source Vcc, the emitter of the NPN transistor 42a is connected to the base of another NPN transistor 41a, and the current It1 is made to flow from each of the emitters of the NPN transistors 41a and 42a. In FIG. 11B, the emitter of an NPN transistor 43a is operated as the cathode and a common connection section of the collector and base of the NPN transistor 43a is operated as the anode. Thus, the sum of the respective base/emitter voltages Vbe41 and Vbe42 of the two NPN transistors 41a and 42a corresponding to the current value of the power source It1 is regarded as a voltage for two diodes. Also, the base/emitter voltage Vbe43 of the NPN transistor 43a corresponding to the current value of the power source Ic2 is regarded as a voltage for one diode.

Note that the respective emitter currents It1 of the two PNP transistors 11a and 12a in FIG. 10A are supplied from two third current supplying circuits 280 which have been provided here, respectively. The respective emitter currents It1 of the two NPN transistors 41a and 42a in FIG. 11A are also supplied from the two third current supplying circuits 280, respectively.

Figure 12:
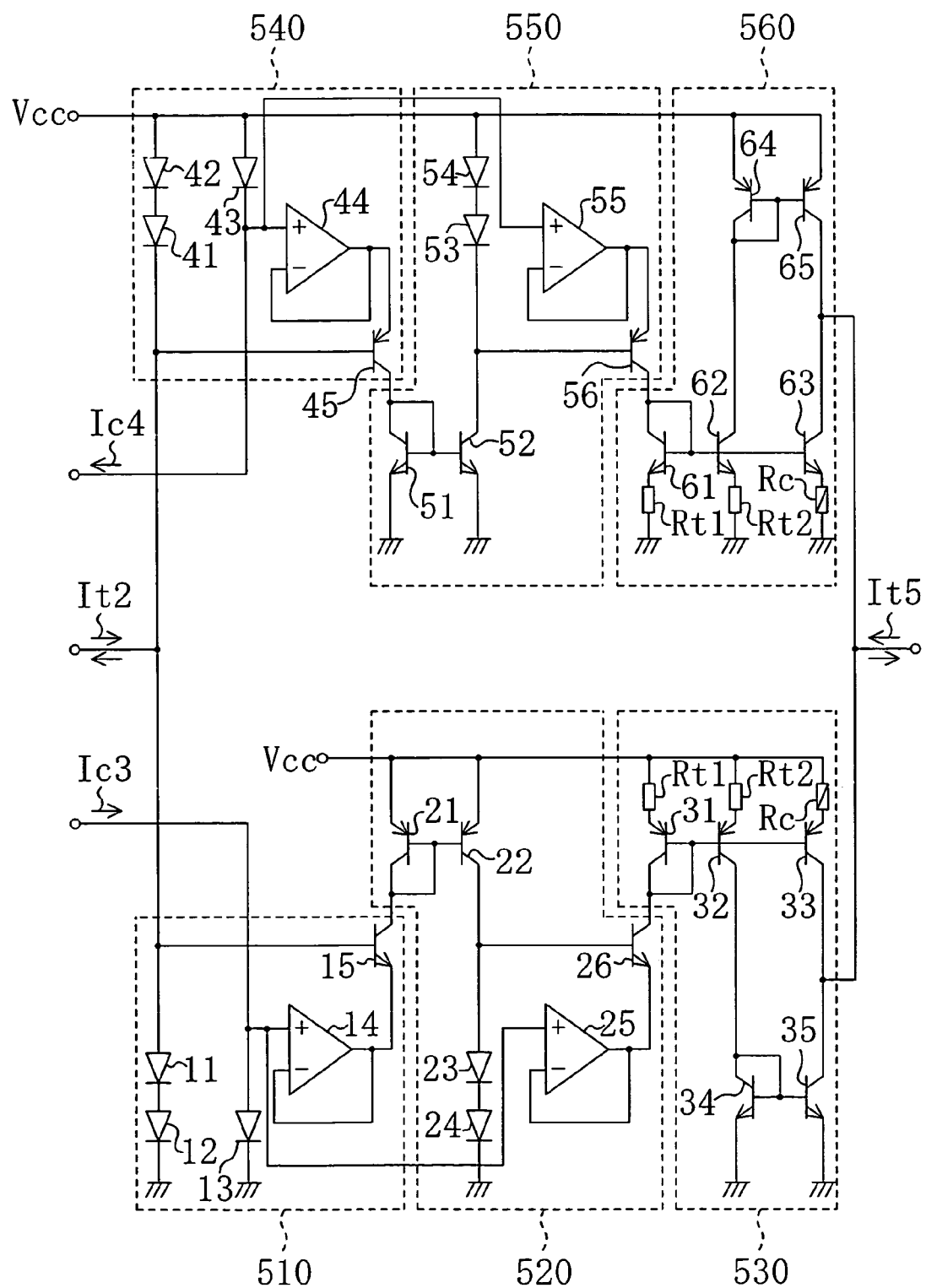
FIG. 12 is a circuit diagram illustrating the detailed configuration of a fifth-order function generator of FIG. 1.

FIG. 12 shows the detailed configuration of the fifth-order function generator 500 of FIG. 1. The fifth-order function generator 500 of FIG. 12 includes a first current exchanger circuit 510, a second current exchanger circuit 520, a third exchanger circuit 530, a fourth current exchanger circuit 540, a fifth current exchanger circuit 550, and a sixth current exchanger circuit 560. The respective configurations of the first, third, fourth and sixth exchanger circuits 510, 530, 540 and 560 are the same as those of the first, second, third and fourth current exchanger circuits 410, 420, 430 and 440, respectively. The second current exchanger circuit 520 of FIG. 12 includes two PNP transistors 21 and 22, two diodes 23 and 24, an operational amplifier 25, and an NPN transistor 26. The fifth current exchanger circuit 550 is a complementary circuit of the second current exchanger circuit 520 and includes two NPN transistors 51 and 52, two diodes 53 and 54, an operational amplifier 55, and a PNP transistor 56.

When Ta≧Tr, the collector current I15 of the NPN transistor 15 in the first current exchanger circuit 510 is a current in proportion to the square of Ta−Tr (see Formula 8). In the second current exchanger circuit 520, the collector current I15 flows into a series of diodes 23 and 24 via the PNP transistors 21 and 22 to generate a voltage at the anode of the diode 23. While the generated voltage is given to the base of the NPN transistor 26, a voltage generated in the diode 13 in the first current exchanger circuit 510 is given to the emitter of the NPN transistor 26 via the operational amplifier 25.

Here, a current value for the current source Ic3 is indicated as Ir, the collector current of the PNP transistor 22 is indicated as I22, a voltage at the anode of the diode 13 is indicated as V13, and a voltage at the anode of the series of diodes 23 and 24 is indicated as V23. Also, the saturation current of each of the diodes and transistors is indicated as Is. In this case, the following formulas hold.

$$V13 = V\text{th} \times \ln(Ir/Is) \qquad \text{[Formula 14]}$$

$$V23 = 2 \times V\text{th} \times \ln(I22/Is) \qquad \text{[Formula 15]}$$

$$V\text{th} = k \times Ta/q \qquad \text{[Formula 16]}$$

where k indicates the Bolzmann's constant and q indicates the charge amount of an electron. Also, when the collector current of the NPN transistor 26 is indicated as I26, the following formula can be obtained.

$$I26 = Is \times \exp\{(V23 - V13)/V\text{th}\} \qquad \text{[Formula 17]}$$

Thus, based on Formulas 14, 15 and 17, the following formula can be obtained.

$$I26 = Ir \times (I22/Ir)^2 \qquad \text{[Formula 18]}$$

Also, since I22=I15 holds, the following formula holds.

$$I22 = Ir \times \{(Ta-Tr)/Tr\}^2 \qquad \text{[Formula 19]}$$

Thus, based on Formulas 18 and 19, the following formula can be obtained.

$$I26 = Ir \times \{(Ta-Tr)/Tr\}^4 \qquad \text{[Formula 20]}$$

That is to say, an output current of the second current exchanger circuit 520 is a current in proportion to the fourth power of Ta−Tr. Accordingly, an output current It5 of the third current exchanger circuit 530 is a current in proportion to the fifth power of Ta−Tr.

Similarly, when Ta<Tr, the fourth, fifth and sixth current exchanger circuits 540, 550 and 560 are operated, so that a current in proportion to the fifth power of |Ta−Tr| can be obtained as an output current It5 of the sixth current exchanger circuit 560.

Note that in FIG. 12, the series of diodes 23 and 24 may be changed to have the same transistor configuration as that in FIG. 1A, and the series of diodes 53 and 54 may be changed to have the same transistor configuration as that in FIG. 1A.

Figure 13:
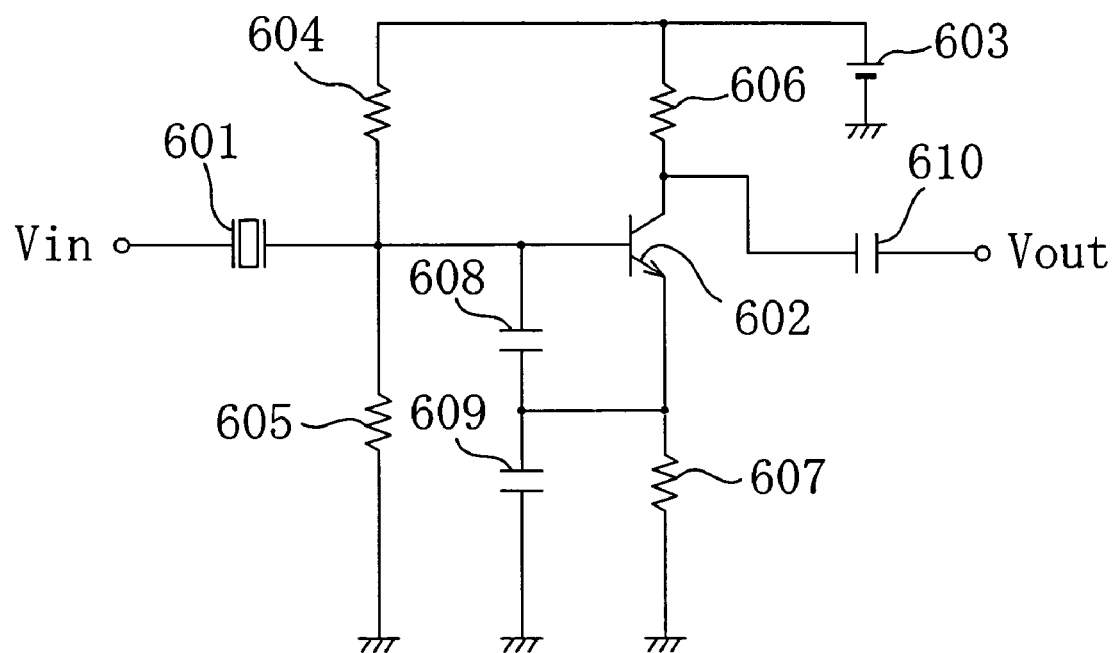
FIG. 13 is a circuit diagram illustrating the detailed configuration of a crystal oscillating circuit of FIG. 1.

FIG. 13 shows the detailed configuration of the crystal oscillating circuit 600 of FIG. 1. The crystal oscillating circuit 600 of FIG. 13 is a Colpitts crystal oscillating circuit and includes a crystal resonator 601, an NPN transistor 602, a constant voltage supply 603, four resistors 604, 605, 606 and 607, two capacitors 608 and 609, and a coupling capacitor 610. Although an output voltage Vout is output from the collector of the NPN transistor 602 in FIG. 13, the output voltage Vout can be output from the emitter of the NPN transistor 602.

As has been described, in the temperature compensated crystal oscillator of FIG. 1, none of the circuits including the cubic function generator 400 and the fifth-order function generator 500 requires a high voltage enough to drive a series circuit of three or more diodes. Therefore, the voltage of the power source terminal Vcc can be made low.

Figure 14:
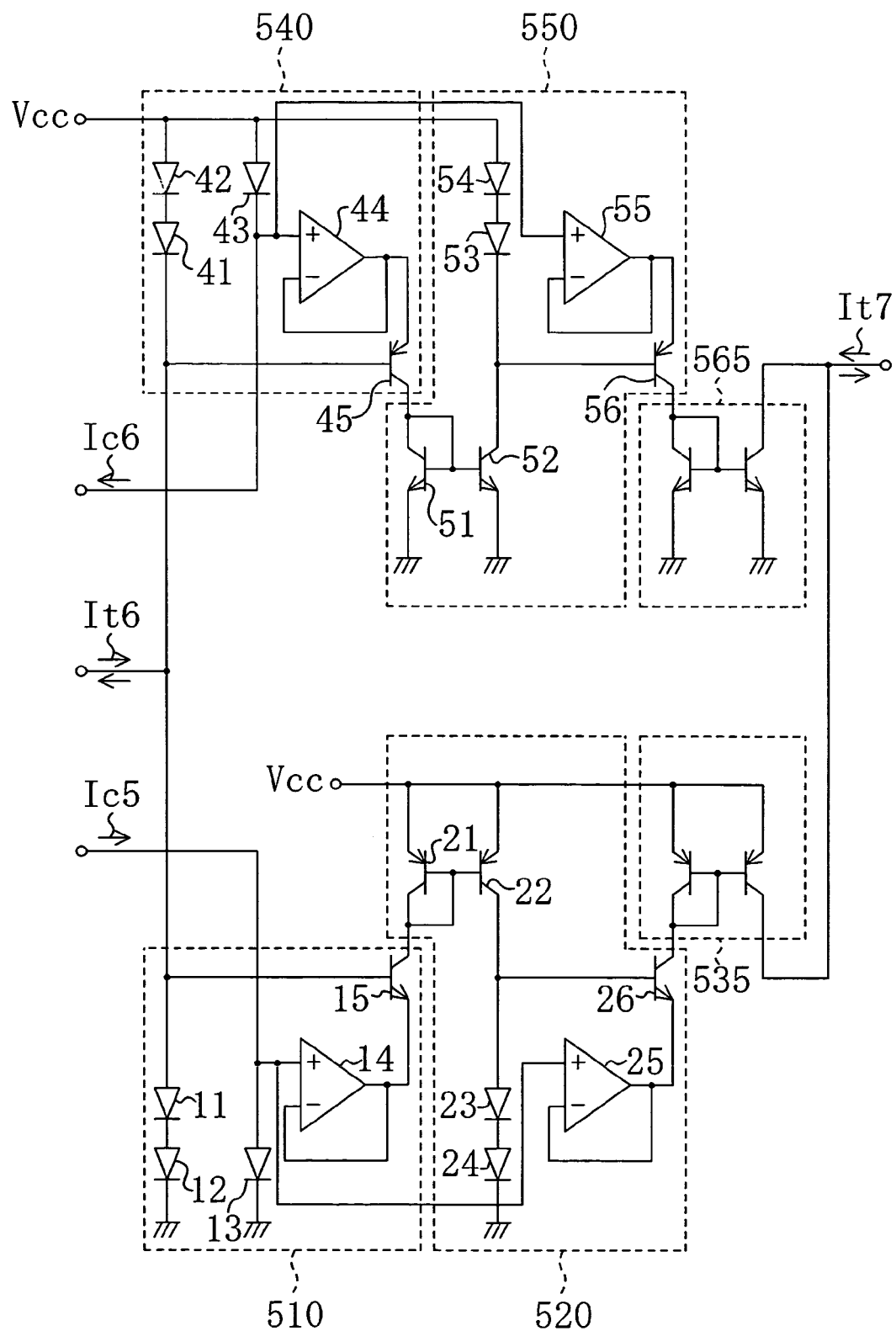
FIG. 14 is a circuit diagram illustrating the detailed configuration of a fourth-order function generator which can be added to the temperature compensated oscillator of FIG. 1.

FIG. 14 shows the detailed configuration of the fourth-order function generator which can be added to the temperature compensated crystal oscillator of FIG. 1. The fourth-order function generator of FIG. 14 is obtained by replacing the third and sixth current exchanger circuits 530 and 560 of FIG. 12 with mere current mirror circuits 535 and 565, respectively. The fourth-order function generator of FIG. 14 is connected to current sources Ic5, Ic6 and It6 to be operated, and can generate a bidirectional current It7 in proportion to the fourth power of Ta−Tr in the case of Ta≧Tr and the fourth power of |Ta−Tr| in the case of Ta<Tr.

Figure 15:
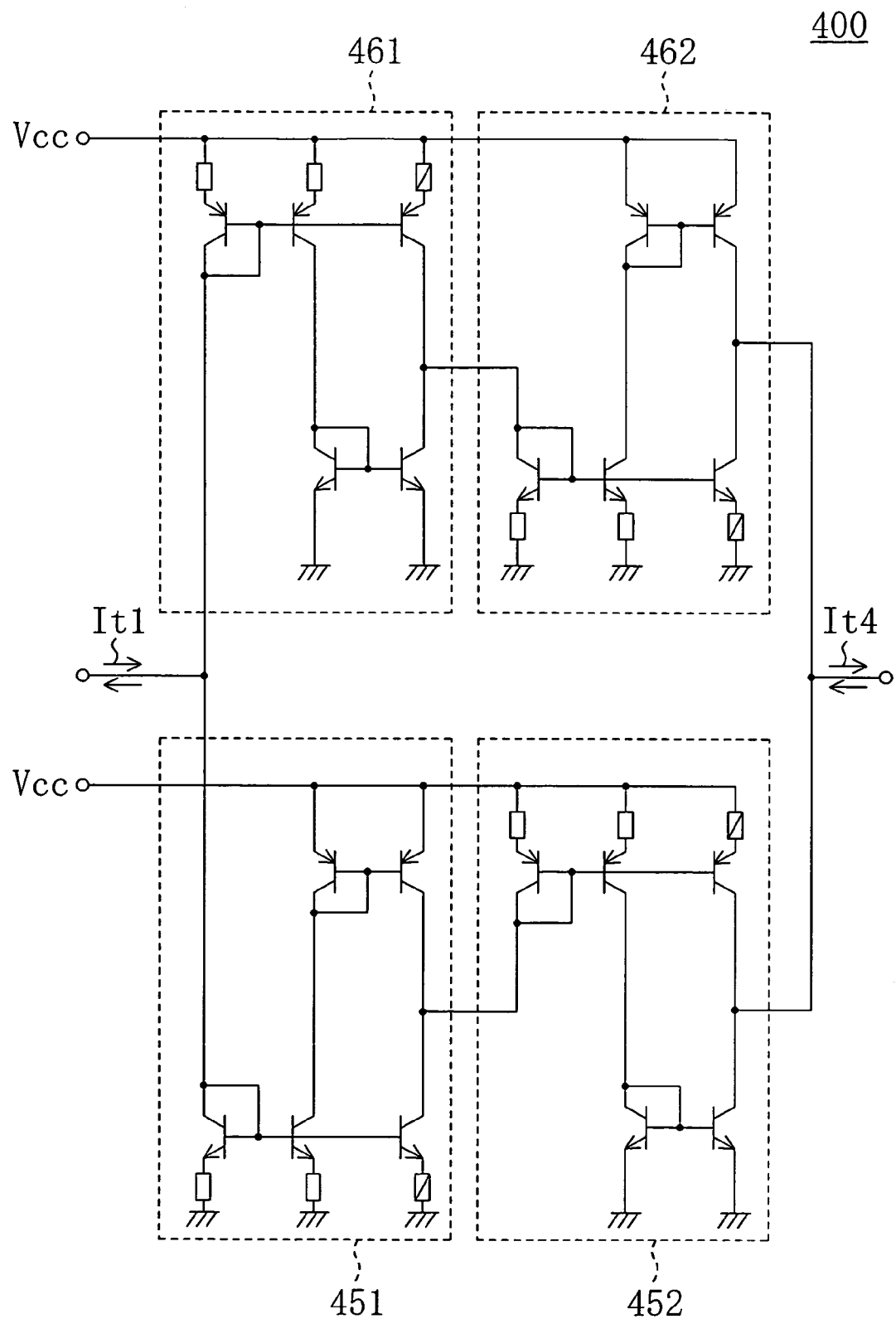
FIG. 15 is a circuit diagram illustrating a modified example of the cubic function generator of FIG. 9.

FIG. 15 shows a modified example of the cubic function generator 400 of FIG. 9. The cubic function generator 400 of FIG. 15 includes a first current exchanger circuit 451, a second current exchanger circuit 452, a third current exchanger circuit 461, and a fourth current exchanger circuit 462. Each one of these current exchanger circuits 451, 452, 461 and 462 receives a current in proportion to the nth power (n is 1 or a larger integer) of Ta−Tr and outputs a current in proportion to the n+1th power of Ta−Tr, based on the same operation principle as that for the operation of the second and fourth current exchanger circuits 420 and 440 in FIG. 9. Therefore, in the cubic function generator 400 of FIG. 15, a bidirectional current It4 in proportion to the cube of Ta−Tr in the case of Ta≧Tr and the cube of |Ta−Tr| in the case of Ta<Tr.

Note that if the number of stages in a cascade connection of the current exchanger circuits of FIG. 15 is increased, a fourth or higher order function generator can be obtained. Moreover, each of the second and fifth current exchanger circuits 520 and 550 of FIGS. 12 and 14 may be replaced with a current exchanger circuit having the same configuration as that of FIG. 15.

As has been described, the function generator and temperature compensated crystal oscillator of the present invention can be operated at a low voltage and, therefore, is useful for portable equipment, represented by a cellular phone, and the like.

What is claimed is:

1. A function generator comprising a cascade connection of two or more current exchanger circuits, in which an output of one current exchanger circuit is connected to an input of the next current exchanger circuit,
   wherein when n is 1 or a larger integer, each of the two or more current exchanger circuits has the function of receiving a current in proportion to the nth power of a difference between an ambient temperature and a reference temperature and outputting a current in proportion to the n+1th or 2nth power of the difference between the ambient temperature and the reference temperature.

2. The function generator of claim 1,
   wherein at least one of the two or more current exchanger circuits includes
      a first circuit including a series connection of two PN junctions into which a current in proportion to the difference between the ambient temperature and the reference temperature flows,
      a second circuit including a PN junction into which a constant current flows regardless of the ambient temperature, and
      an output transistor for receiving between the base and emitter of the output transistor a difference between a voltage generated in the first circuit and a voltage generated in the second circuit, and
   generates a current in proportion to the square of the difference between the ambient temperature and the reference temperature at the collector of the output transistor.

3. The function generator of claim 1,
   wherein at least one of the two or more current exchanger circuits includes
      a first circuit including a series connection of two PN junctions into which a current in proportion to the square of the difference between the ambient temperature and the reference temperature flows,
      a second circuit including a PN junction into which a constant current flows regardless of the ambient temperature, and
      an output transistor for receiving between the base and emitter of the output transistor a difference between a voltage generated in the first circuit and a voltage generated in the second circuit, and
   generates a current in proportion to the fourth power of the difference between the ambient temperature and the reference temperature at the collector of the output transistor.

4. The function generator of claim 1,
   wherein at least one of the two or more current exchanger circuits applies a voltage generated by giving an input current to a resistor having a first temperature coefficient to a resistor having a second temperature coefficient and outputs a current corresponding to a current flowing into the resistor having the second temperature coefficient.

5. The function generator of claim 4, wherein the first temperature coefficient is a linear function of the difference between the ambient temperature and the reference temperature, and
   wherein the second temperature coefficient is constant regardless of the ambient temperature.

6. A temperature compensated crystal oscillator comprising:
   a crystal oscillator using a crystal resonator;
   control means for controlling the oscillation frequency of the crystal oscillating circuit in accordance with a compensation voltage corresponding to the ambient temperature; and
   a function generator for generating the compensation voltage,
   wherein the function generator includes a cascade connection of two or more current exchanger circuits, in which an output of one current exchanger circuit is connected to an input of the next current exchanger circuit, and
   wherein when n is 1 or a larger integer, each of the two or more current exchanger circuits has the function of receiving a current in proportion to the nth power of a difference between the ambient temperature and a reference temperature and outputting a current in proportion to the n+1th or 2nth power of the difference between the ambient temperature and the reference temperature.

* * * * *